United States Patent
Robinson et al.

(10) Patent No.: US 6,781,468 B1
(45) Date of Patent: Aug. 24, 2004

(54) PHOTO-AMPLIFIER CIRCUIT WITH IMPROVED POWER SUPPLY REJECTION

(75) Inventors: Michael A. Robinson, Fremont, CA (US); Graham M. Flower, San Jose, CA (US); Kirk S. Giboney, Santa Rosa, CA (US)

(73) Assignee: Agilent Technologies, Inc, Palo Alto, CA (US)

( * ) Notice: Subject to any disclaimer, the term of this patent is extended or adjusted under 35 U.S.C. 154(b) by 0 days.

(21) Appl. No.: 10/426,744

(22) Filed: Apr. 30, 2003

(51) Int. Cl.[7] .................................................. H03F 3/08
(52) U.S. Cl. ........................... 330/308; 250/214 A
(58) Field of Search ............................... 330/308, 258, 330/124 R, 84, 98, 310; 250/214 A

(56) References Cited

U.S. PATENT DOCUMENTS

| | | | |
|---|---|---|---|
| 4,575,629 A | 3/1986 | Schnell et al. | 250/238 |
| 5,521,555 A | 5/1996 | Tazartes et al. | 330/308 |
| 5,589,682 A | 12/1996 | Brown et al. | 250/214 A |
| 5,691,663 A | 11/1997 | Nayebi et al. | 327/560 |
| 5,945,878 A | 8/1999 | Westwick et al. | 330/301 |
| 5,955,918 A * | 9/1999 | Uno | 330/9 |
| 6,259,322 B1 | 7/2001 | Muza | 330/257 |
| 6,323,734 B1 * | 11/2001 | Henrion et al. | 330/308 |
| 6,329,878 B1 | 12/2001 | Edwards et al. | 330/264 |
| 6,597,245 B2 * | 7/2003 | Yamazaki | 330/308 |

FOREIGN PATENT DOCUMENTS

| | | | |
|---|---|---|---|
| JP | 60-157307 | * | 8/1985 |
| JP | 3-165609 | * | 11/1989 |

OTHER PUBLICATIONS

Kirk Giboney et al.; *Next–Generation Parallel–Optical Data Links*, IEEE 2001; pp. 859–860.
I. A. Buckman et al.; *Parallel Optical Interconnects*; Thursday Afternoon, CLEO 2000; pp. 535–536.
Kirk Giboney et al.; *The PONI Optoelectronic Platform*; IEEE 1999; pp. 25–26.
Paul Rosenberg et al.; *The PONI–I Parallel–Optical Link*; IEEE 1999; pp. 763–769.
Kirk S. Giboney et al.; *The Ideal Light Source for Datanets*; IEEE Spectrum; Feb. 1998; pp. 43–53.
A. Yuen et al.; *Parallel Optical Interconnections Development at HP Labs*; IEEE 1997; pp. 191–192.
Al Yuen et al.; *Parallel Optical Links for Gigabyte/s Data Communication*; IEEE 1997; pp. 193–196.
Kenneth H. Hahn et al.; *Gigabyte/s Data Communications with the POLO Parallel Optical Link*; IEEE 1996; pp. 301–307.

* cited by examiner

*Primary Examiner*—Henry Choe

(57) ABSTRACT

A symmetrical photo-amplifier circuit with improved power supply rejection includes a signal circuit and a reference circuit, in which the electrical capacitances and parasitic capacitances from mechanical sources, such as bond wires and substrates, are matched between the signal circuit and the reference circuit.

23 Claims, 8 Drawing Sheets

PHOTO-AMPLIFIER CIRCUIT WITH IMPROVED POWER SUPPLY REJECTION

BACKGROUND OF THE INVENTION

1. Technical Field of the Invention

The present invention relates generally to high-frequency photo-amplifier circuits, and more particularly to power supply rejection of high-frequency photo-amplifier circuits.

2. Description of Related Art

The ability of a circuit to disregard noise on the supply line is referred to as the power supply rejection of the circuit. High frequency circuits have traditionally had poor power supply rejection due to the high bandwidth handled by the circuits. For example, in high frequency photo-amplifier circuits with large bandwidths in the gigabit/s range, it has become increasingly difficult to filter noise on the supply line.

In addition, with the increase in the number of components placed on a circuit board, there has been a corresponding increase in the amount of broadband noise observed on the supply line. If the level of noise is significant enough, the integrity of any signal produced by the photo-amplifier circuit may be degraded.

Conventional mechanisms for improving the power supply rejection in photo-amplifier circuits have included complex and elaborate filters and/or differential amplifier circuits, used for common mode rejection of noise signals. However, as bandwidths increase and the number of components per board increase, there is a need for improved power supply rejection in photo-amplifier circuits.

SUMMARY OF THE INVENTION

Embodiments in accordance with the invention provide a symmetrical photo-amplifier circuit with improved power supply rejection. Typically, the photo-amplifier circuit includes a signal circuit and a reference circuit, in which the inductances and parasitic capacitances from mechanical sources, such as bond wires and substrates, are matched between the signal circuit and the reference circuit. The signal circuit and reference circuit are typically coupled to a filly differential preamplifier circuit for common mode rejection of noise signals on the power supply line. The signal circuit typically receives an optical signal on the power supply line and is coupled to an input of a first amplifier. The reference circuit is typically electrically similar to the signal circuit and receives a noise signal substantially identical to the noise signal received at the signal circuit. The reference circuit is further coupled to an input of a second amplifier. Signals output from the first and second amplifiers are input to a differential amplifier for common mode rejection of the noise signals.

BRIEF DESCRIPTION OF THE DRAWINGS

The disclosed invention will be described with reference to the accompanying drawings, which show important sample embodiments of the invention and which are incorporated in the specification hereof by reference, wherein.

DETAILED DESCRIPTION OF EXEMPLARY EMBODIMENTS

The teachings of the present application will be described with particular reference to exemplary embodiments in accordance with the invention. However, it should be understood that these embodiments provide only a few examples of the many advantageous uses of the teachings herein. In general, statements made in the specification do not necessarily delimit any of the various claimed inventions. Moreover, some statements may apply to some inventive features, but not to others.

Figure 1:
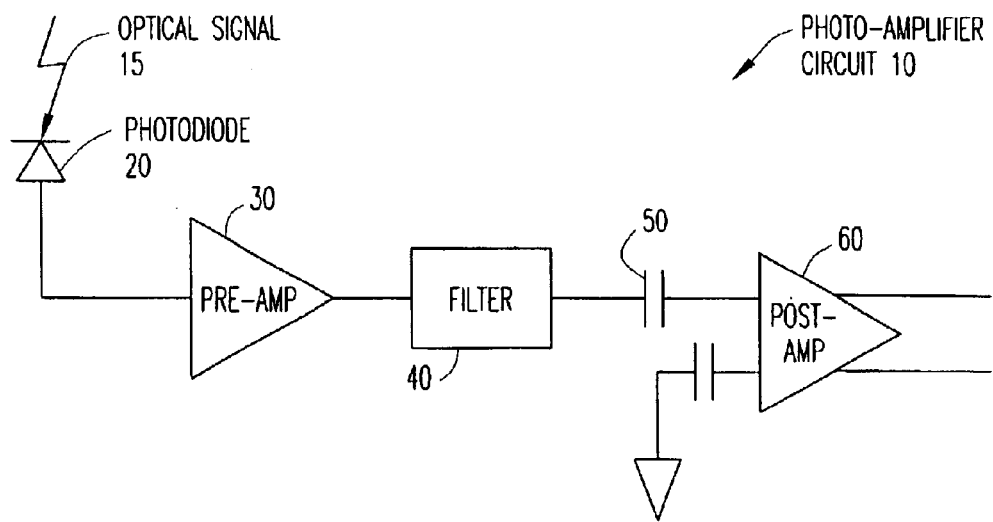
FIG. 1 is a circuit diagram of a conventional photo-amplifier circuit.

FIG. 1 illustrates a conventional photo-amplifier circuit 10 for receiving an optical signal and producing an electrical signal (e.g., voltage) indicative of the intensity of the received optical signal that is suitable for subsequent processing. Photo-amplifier circuit 10 includes photodetector 20 (e.g., a photodiode) connected to receive optical signal 15 and output a current based on the intensity of optical signal 15. Photodiode 20 is further connected to transimpedance preamplifier 30 for conversion of the current into a voltage. The voltage produced by transimpedance preamplifier 30 is AC coupled to postamplifier 60 via capacitor 50, where the voltage is differentially amplified and output as a differential digital signal. Filtering stage 40 is connected between transimpedance preamplifier 30 and postamplifier 60 to filter the input to postamplifier 60.

The current produced by photodiode 20 is reflective of not only the intensity of optical signal 15, but also the amount of supply noise in the circuit 10. Sources of noise signals can include crosstalk between multiple channels on the chip or stray signals from other components on the board. Transimpedance preamplifer 30 has a single-ended input connected to receive the current from photodiode 20. Therefore, any noise present in the current will be converted to a voltage and fed to differential postamplifier 60. If the frequencies and amount of noise are low, differential postamplifier 60 may be able to reject the noise signals. However, as frequencies increase and the number of components per board increase, thereby increasing the amount of noise on the supply line to the preamplifier 30, differential postamplifier 60 may not able to effectively reject noise signals. As a result, conventional photo-amplifier circuits 10 are not suitable for use in high frequency circuits due to the poor power supply noise and poor frequency response at higher frequencies.

Figure 2:
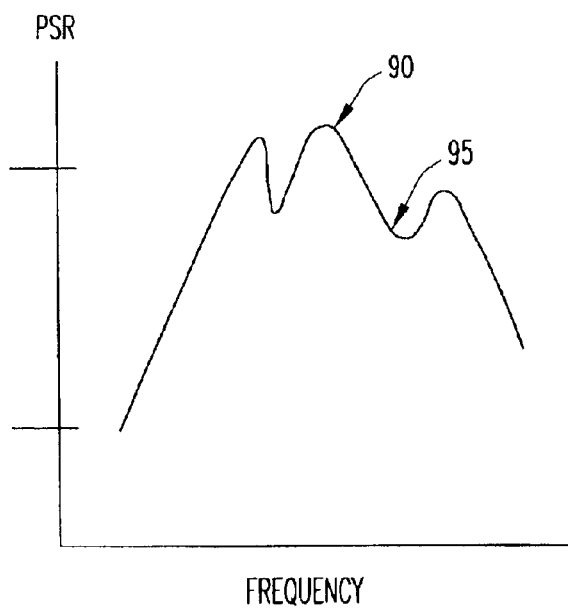
FIG. 2 illustrates the frequency response to power supply rejection of a conventional photo-amplifier circuit.

FIG. 2 illustrates the frequency response to power supply rejection of a conventional photo-amplifier circuit. As can be seen in FIG. 2, as the frequency increases, the overall power supply rejection and frequency response to the signal decreases. Various peaks 90 and valleys 95 in the frequency response can be attributed to signal injection at the photodiode. Traditionally, circuit manufacturers have attempted to improve the power supply rejection by filtering the supply. However, filtering may not completely remove the noise signal, and can be fairly complex to implement.

Figure 3:
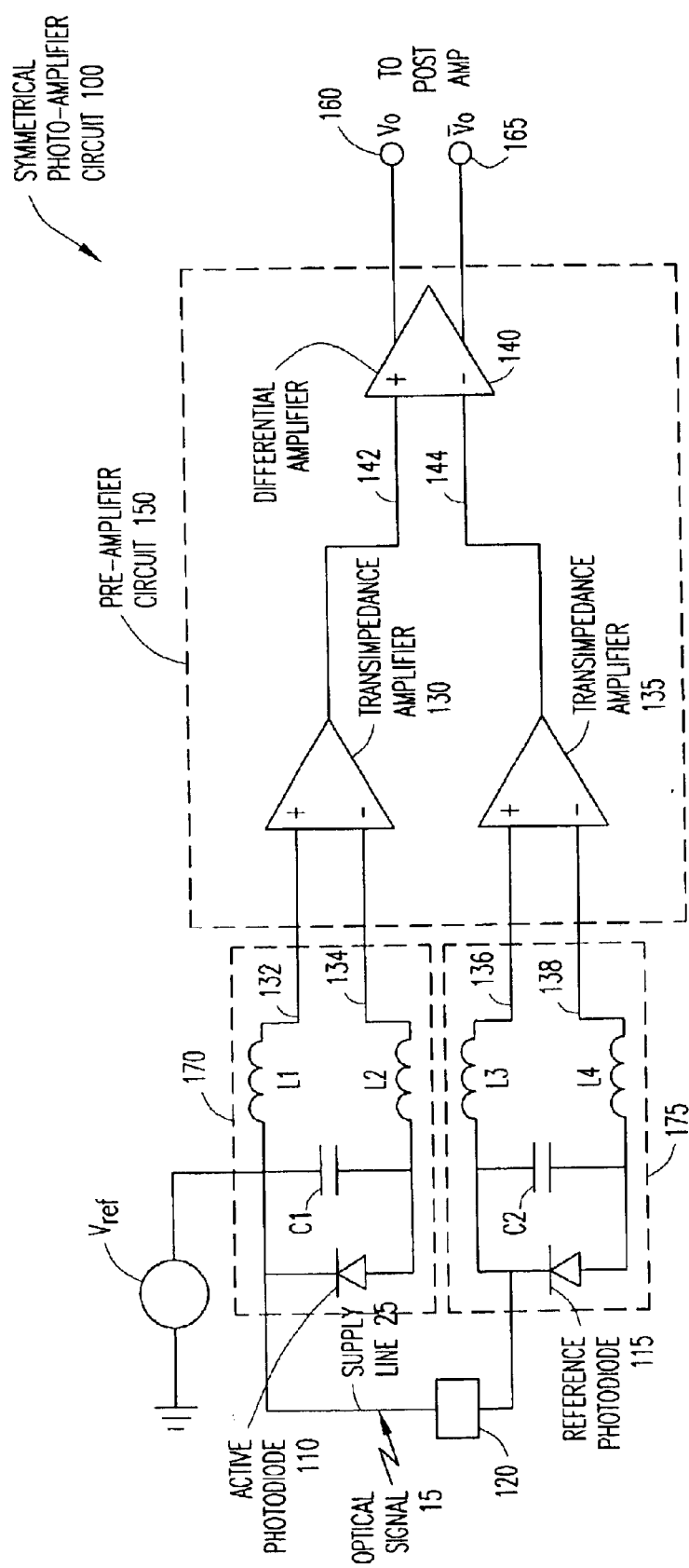
FIG. 3 is an exemplary circuit diagram of a symmetrical photo-amplifier circuit, in accordance with the invention.

Therefore, as shown in FIG. 3, in accordance with the invention, a symmetrical photo-amplifier circuit can be used to improve power supply rejection. Symmetrical photo-amplifier circuit 100 includes both signal circuit 170 and reference circuit 175. Signal circuit 170 includes active photodiode 110, and reference circuit 175 includes reference photodiode 115. Reference photodiode 115 is electrically similar to active photodiode 110 so as to track the impedances and capacitances of active photodiode 110. For example, active photodiode 110 and reference photodiode 115 can both be constructed from the same material, such as indium phosphide (InP) or gallium arsenide (GaAs). In addition, both active photodiode 110 and reference photodiode 115 can be constructed during the same fabrication process so that any variances in performance will be substantially identical between active photodiode 110 and reference photodiode 115. The cathode of reference photodiode 115 is connected to the cathode of active photodiode 110 via a low electrical impedance 120, such as a common plane (as shown) or a separate reference voltage source.

Active photodiode 110 and reference photodiode 115 are coupled to fully differential preamplifier circuit 150 for common mode rejection of noise signals on supply line 25. Active photodiode 110 receives optical signal 15 and converts optical signal 15 to a current representative of the intensity of incident light in optical signal 15. Any noise signal present on supply line 25 will also be converted and included in the input current. Active photodiode 110 is coupled via signal paths 132 and 134 of signal circuit 170 to feed the current to an input of first transimpedance amplifier 130 of preamplifier circuit 150 for conversion of the current to a voltage.

Reference photodiode 115 receives a noise signal that includes signals induced between cathode and anode transients. The noise signal received at reference photodiode 115 is substantially identical to the noise signal received at the active photodiode 110. Reference photodiode 115 is further coupled via signal paths 136 and 138 of reference circuit 175 to feed a current representative of the noise signal to an input of second transimpedance amplifier 135 of preamplifier circuit 150 for conversion of the current to a voltage.

Voltage signals output from first and second amplifiers 130 and 135, respectively, are input to differential amplifier 140 of preamplifier circuit 150 for amplification of the optical voltage signal and common mode rejection of the noise voltage signal. The voltage signal produced by first transimpedance amplifier 130 is fed to noninverting input 142 of differential amplifier 140 and the voltage signal produced by second transimpedance amplifier 135 is fed to inverting input 144 of differential amplifier 140. The optical voltage signal is output as a differential digital signal to nodes Vo and Vo Bar 160 and 165, respectively, for further signal processing, such as further amplification by a post-amplifier circuit (as shown in FIG. 1) and clock and data recovery.

To further improve power supply rejection, symmetrical photo-amplifier circuit 100 can be fabricated so as to match electrical inductances and parasitic capacitances from mechanical sources, such as bond wires and substrates. Therefore, inductors L1 and L3 from bond wire parasitics can be constructed to match as well as similar inductors L2 and L4. Likewise, capacitors C1 and C2, each of which include device and parasitic capacitances, can be constructed to match each other.

Figure 4:
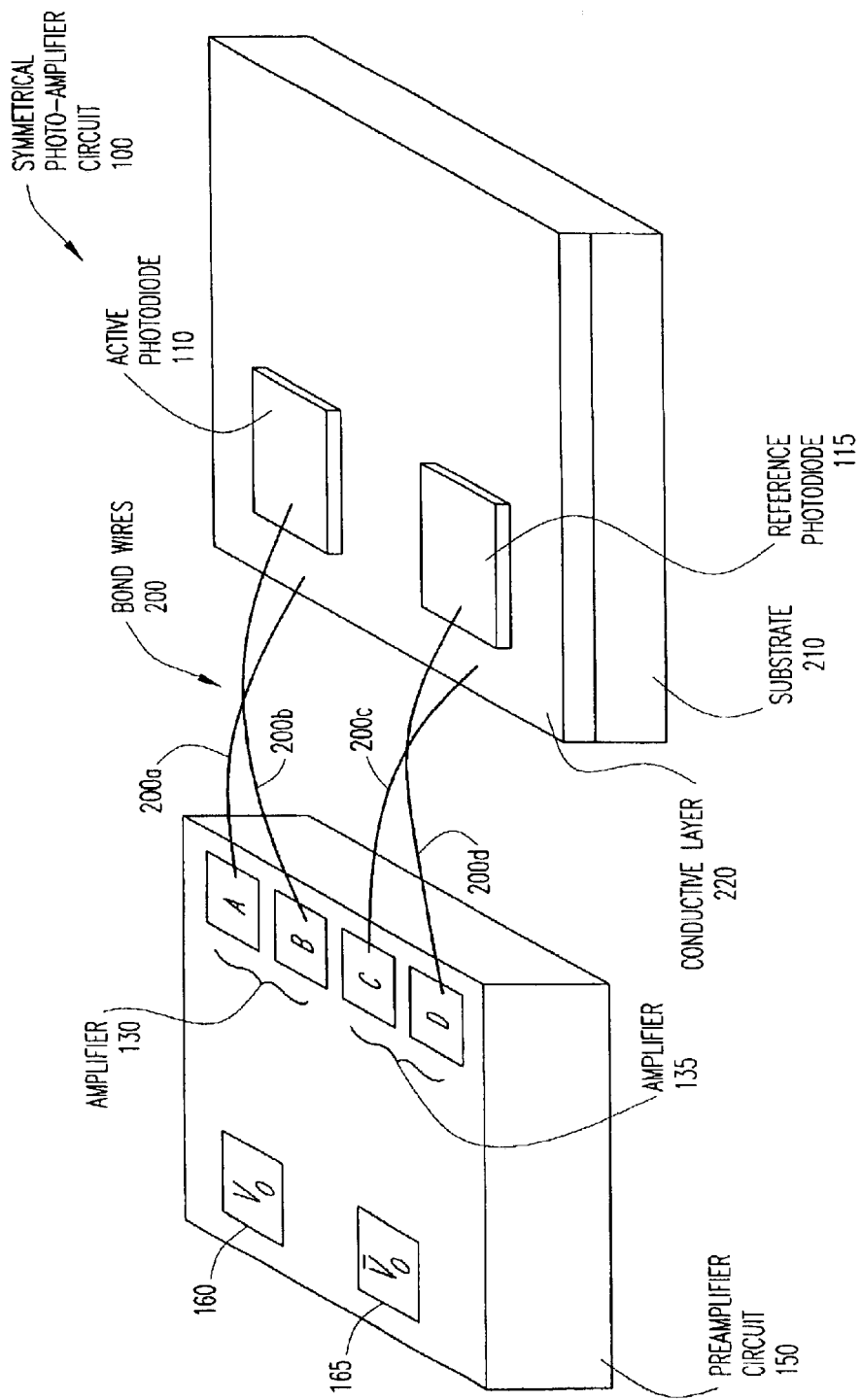
FIG. 4 is a perspective view of an exemplary mechanical construction of the symmetrical photo-amplifier circuit, in accordance with the invention.

For example, referring now to FIG. 4, an example of the mechanical construction of symmetrical photo-amplifier circuit 100 in accordance with the invention is illustrated.

Inductances and parasitic capacitances can be introduced from a variety of mechanical sources, such as bond wires and substrates. In order to match parasitic capacitances affecting the signals amplified by preamplifier circuit 150 and output via Vo and Vo Bar 160 and 165, respectively, all mechanical sources can be matched between the active and reference signal paths. For example, the length of bond wires 200 and mutual inductance in the bond wires 200 between photodiodes 110 and 115 and preamplifier circuit 150 can be matched. As such, bond wires 200a and 200b connecting cathodes of photodiodes 110 and 115 to noninverting inputs A and C of first and second transimpedance amplifiers 130 and 135, respectively, can have the same length and mutual inductance and bond wires 200b and 200d connecting anodes of photodiodes 110 and 115 to inverting inputs B and D of first and second transimpedance amplifiers 130 and 135, respectively, can have the same length and mutual inductance.

In addition, both active photodiode 110 and reference photodiode 115 can be fabricated on substrate 210 so that any variances in substrate doping from design specifications will match between active photodiode 110 and reference photodiode 115. Further, any variances in the chemical composition or thickness in conductive layer 220 from design specifications will match between active photodiode 110 and reference photodiode 115. Therefore, the power supply rejection of symmetrical photo-amplifier circuit 100 is limited only by mismatches between active photodiode 110 and reference photodiode 115 resulting from statistical variations in the lithography process. Any mismatches should be relatively small with little or no effect on the power supply rejection. Although photodiodes 110 and 115 are illustrated in FIG. 4 as being located on a separate chip from preamplifier circuit 150, it should be understood that in other embodiments in accordance with the invention, photodiodes 110 and 115 can be fabricated on the same chip as preamplifier circuit 150, thus removing the need for bond wires 200 to interconnect photodiodes 110 and 115 and preamplifier circuit 150. In still further embodiments, the photodiodes 115 and 110 can be on a separate chip flip chipped onto the preamplifier chip.

Figure 5:
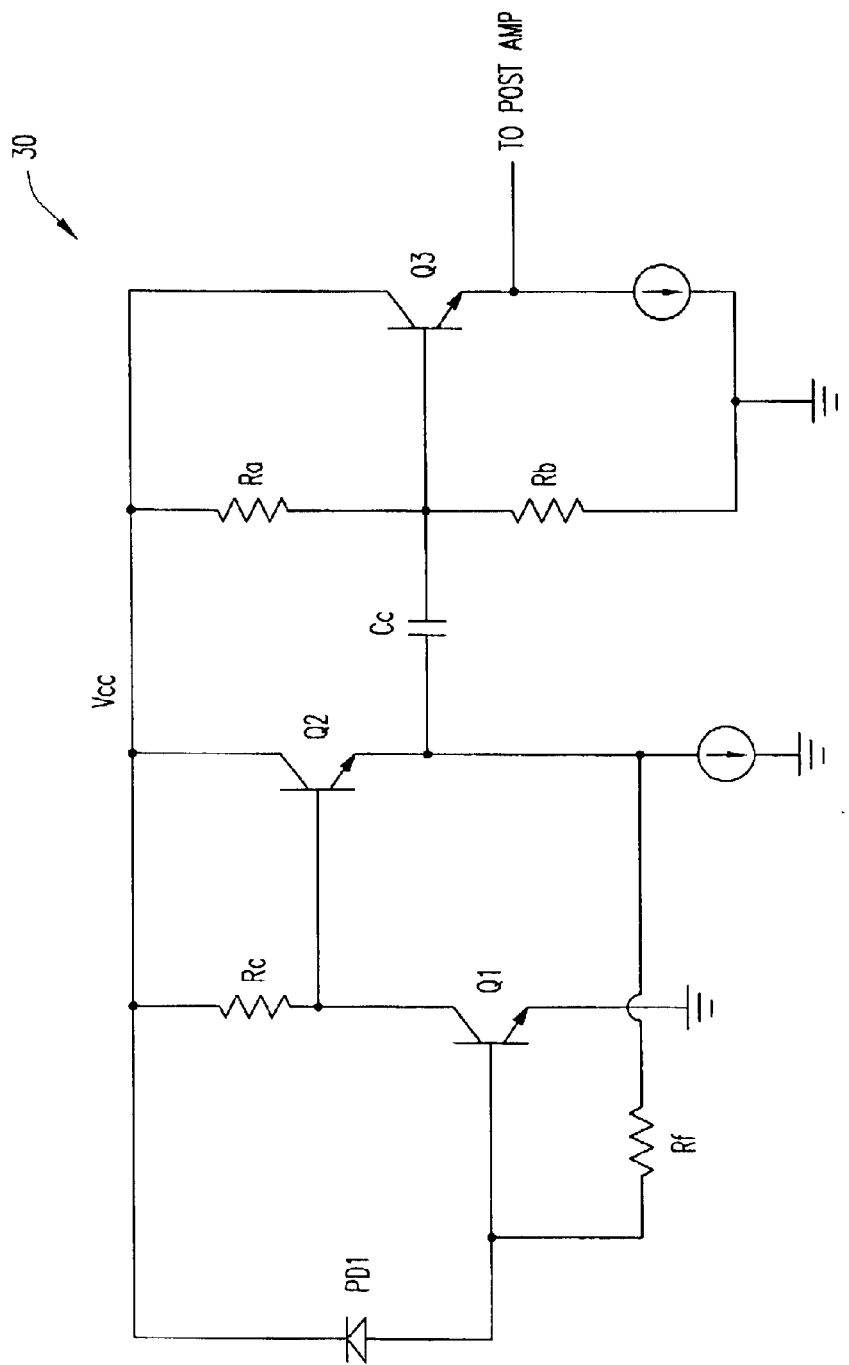
FIG. 5 is an exemplary circuit schematic of a conventional preamplifier circuit, in accordance with the invention.
Figure 6:
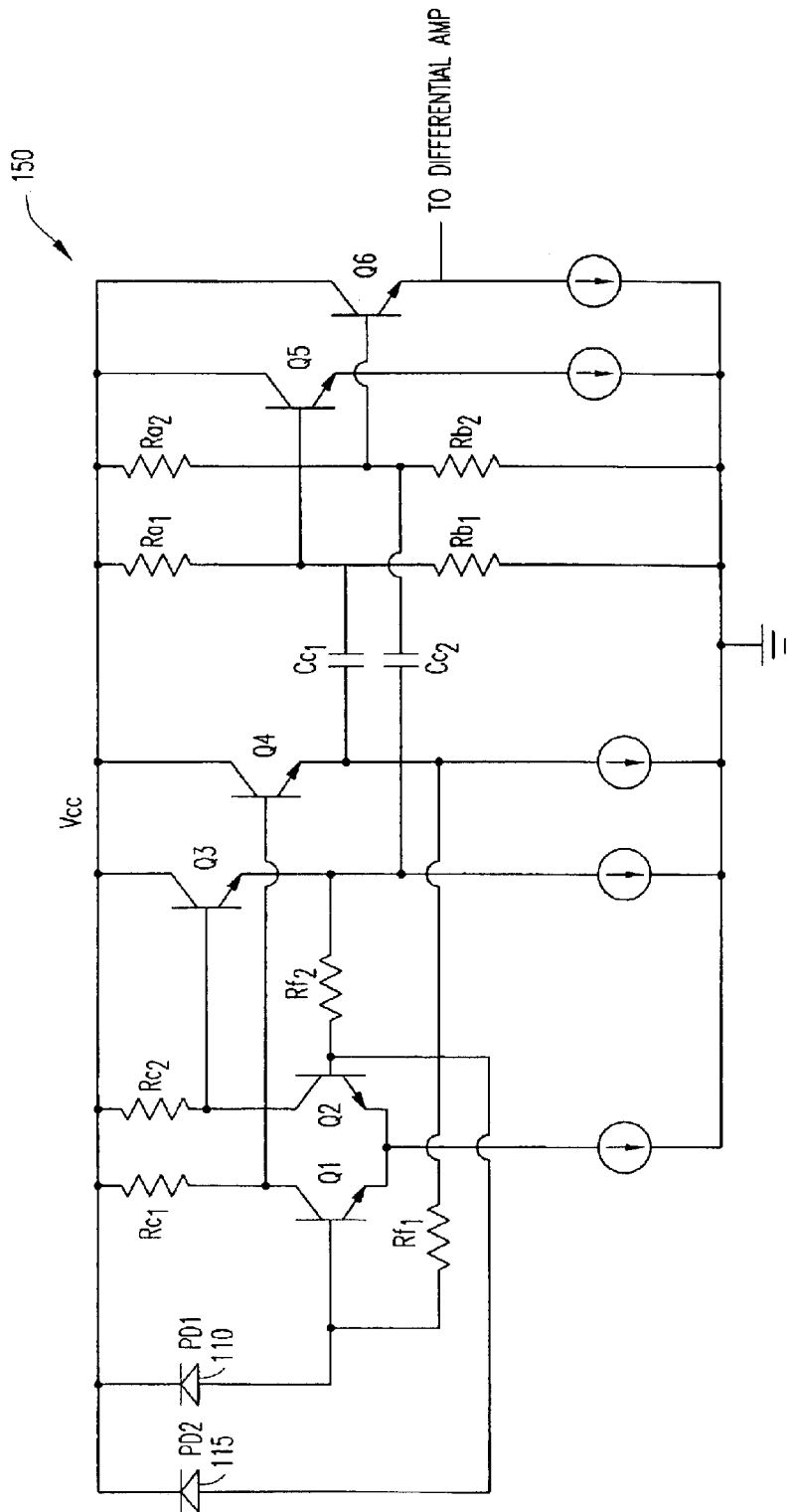
FIG. 6 is an exemplary circuit schematic of a symmetrical preamplifier circuit of a photo-amplifier circuit, in accordance with the invention.

Referring now to FIGS. 5 and 6, there is illustrated circuit schematics of a single ended preamplifier circuit 30 and a symmetrical preamplifier circuit 150, in accordance with the invention. In the conventional single ended transimpedance preamplifier circuit 30, as shown in FIG. 5, an optical signal (current) is produced by photodiode PD1 and received at the input of transistor Q1, which amplifies the optical signal. Transistor Q2 functions as a buffer and resistor Rf functions as a shunt feedback element to feed current back to the input of transistor Q1. The feedback element lowers the impedance of the input of transistor Q2, and therefore improves the bandwidth of the preamplifier 30. Photodiode PD1 appears to the circuit to be a capacitor, which provides an RC time constant in the front end since the photodiode capacitance is large relative to that of the transistors in the circuit.

The signal is AC coupled forward from transistor Q1 via capacitor Cc to the output of the preamplifier circuit 30 in a manner that preserves the shape of the signal as much as possible, by utilizing a resistor divider formed of resistors Ra and Rb and transistor Q3, which functions as a buffer. Any noise present on the supply line Vcc feeds down through resistor Rc, transistor Q2 and resistor Rf toward the input to transistor Q1. Therefore, any movement in the supply line results in a change in the voltage at the base of transistor Q1, which is amplified along with the input signal.

In FIG. 6, a symmetrical preamplifier circuit 150, in accordance with the invention, is shown. The optical signal produced by active photodiode PD110 is amplified the same as in the single ended preamplifier circuit of FIG. 5. Thus, the optical signal is amplified by transistor Q1 and resistor $Rc_1$, buffered by transistor Q4 and fed back to the base of transistor Q1 by resistor $Rf_1$. In addition, the optical signal is AC coupled to the output of the preamplifier circuit 150 the same as the single ended circuit of FIG. 5 through capacitor $Cc_1$ and transistor Q6 utilizing a resistor divider formed of resistors $Ra_1$ and $Rb_1$. The feedback element performs the same function as in FIG. 5 of lowering the impedance of the input to transistor Q1.

However, in FIG. 6, a noise signal on the supply line Vcc is fed not only to the base of transistor Q1 through resistor $Rc_1$, transistor Q4 and resistor $Rf_1$, but also to the base of transistor Q2 through resistor $Rc_2$, transistor Q3 and resistor $Rf_2$. Similarly, the noise signal can propagate not only through active photodiode PD1 110 to the base of transistor Q1, but also through reference photodiode PD2 115 to the base of transistor Q2. Furthermore, the noise signal is AC coupled to the output towards the differential amplifier not only through capacitor $Cc_1$ and transistor Q6 utilizing a resistor divider formed of resistors $Ra_1$ and $Rb_1$, but also through capacitor $Cc_2$ and transistor Q5 utilizing a resistor divider formed of resistors $Ra_2$ and $Rb_2$. Hence, the noise signals from the supply have equal paths in impedance that match over frequency and temperature. The noise signals from the supply can be applied to a differential amplifier (not shown in FIG. 6) that amplifies differential signals (the optical signal from photodiode PD1 110), but rejects common mode signals (the noise signals from photodiodes PD1 110 and PD2 115) to cancel the noise signals.

Figure 7:
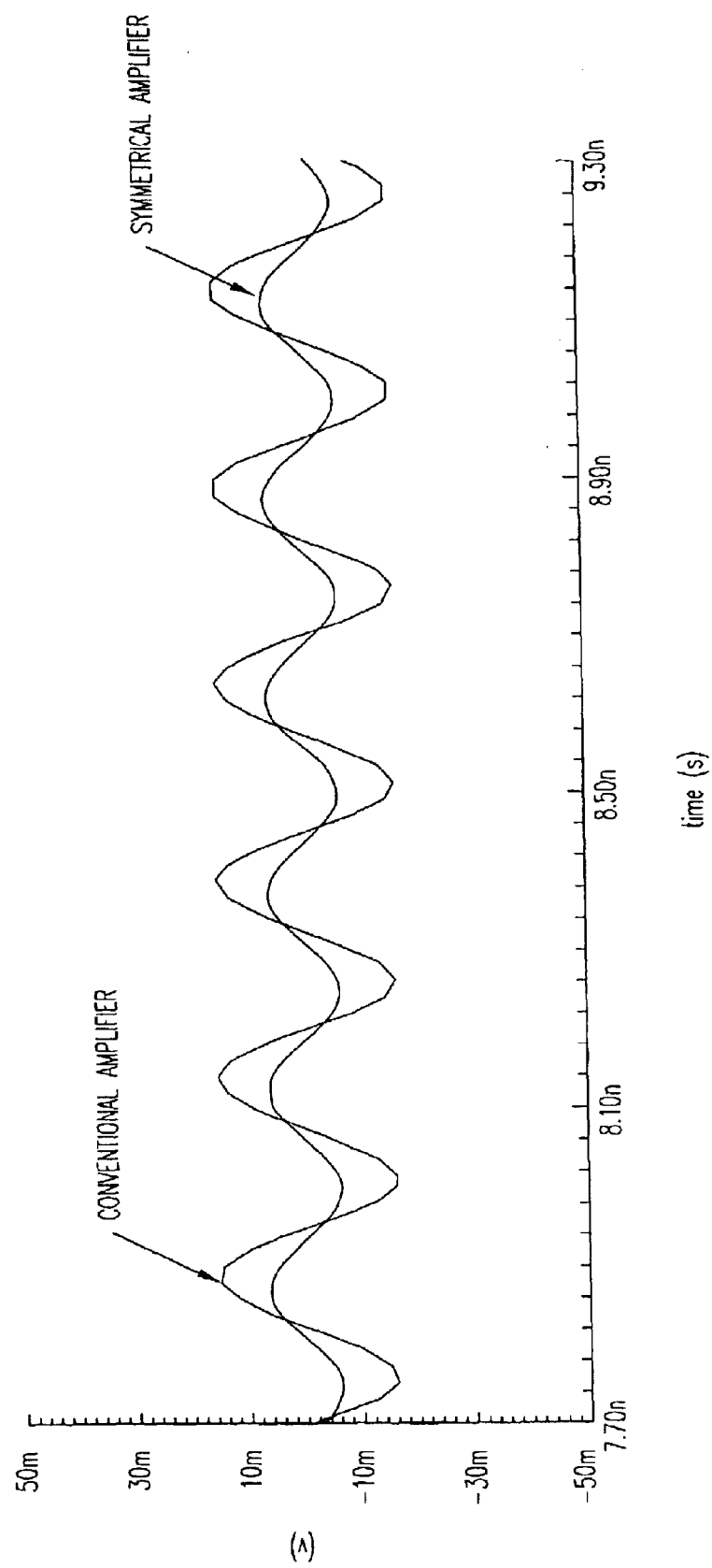
FIG. 7 illustrates sample output waveforms for both a conventional differential preamplifier and a symmetrical differential preamplifier of the type shown in FIG. 3.

FIG. 7 illustrates sample output waveforms for both a conventional differential preamplifier and a symmetrical differential preamplifier of the type shown in FIG. 3. Both output waveforms are representative of differential preamplifier outputs with a 4 Ghz sine wave of 10 mV on the supply line. As can be seen, the output waveform for the conventional differential preamplifier is much larger than the output waveform for the symmetrical differential preamplifier. Therefore, the power supply rejection of the symmetrical differential preamplifier is better than that of the conventional differential preamplifier.

Figure 8:
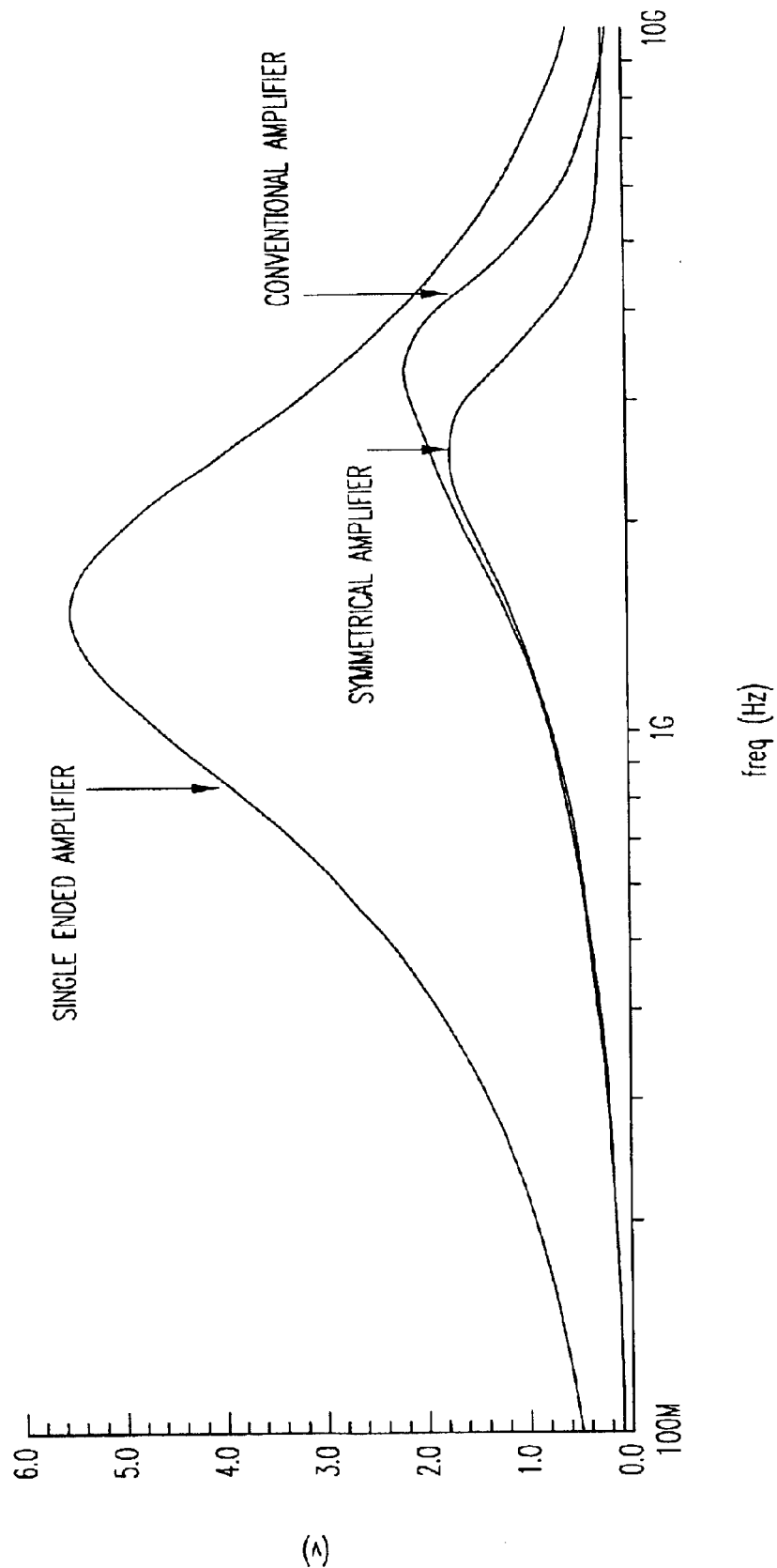
FIG. 8 illustrates the AC gain over frequency for a conventional differential preamplifier, a conventional single ended transimpedance preamplifier and a symmetrical differential preamplifier of the type shown in FIG. 3.

FIG. 8 shows a comparison of the AC gain over frequency between a conventional differential preamplifier, a conventional single ended transimpedance preamplifier and a symmetrical differential preamplifier of the type shown in FIG. 3. As can be seen in FIG. 8, the high frequency gain from the supply to the output is larger for the conventional photo-amplifiers. Higher gain corresponds to larger signals on the output. Therefore, the conventional preamplifiers produce a larger output waveform in response to a noise signal on the supply line. As a result, the possibility that the output will toggle to produce erroneous data is greater with the conventional preamplifiers than with the symmetrical preamplifier.

Figure 9:
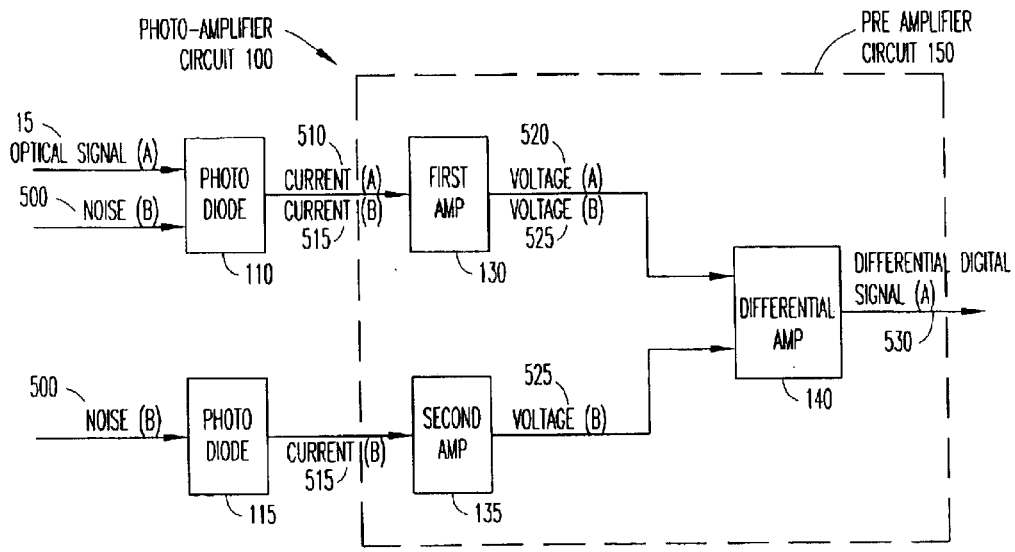
FIG. 9 is a block diagram illustrating exemplary signal flow within the symmetrical photo-amplifier circuit, in accordance with the invention.

FIG. 9 is a block diagram illustrating exemplary signal flow within the symmetrical photo-amplifier circuit, in accordance with the invention. As discussed above in connection with FIG. 3, active photodiode receives optical signal (A) 15 and noise signal (B) 500 and converts optical signal (A) 15 and noise signal (B) 500 to a current that has an element representative of optical signal (A) 510 and an element representative of noise signal (B) 515. Noise signal (B) 500 is also received at reference photodiode 115, where noise signal (B) 500 is converted into a current (B) 515.

Current elements (A+B) 510 and 515 are fed to an input of first transimpedance amplifier 130 of preamplifier circuit 150 for conversion of current elements 510 and 515 (A+B) to a voltage that has elements (A) 520 and (B) 525. Current (B) 515 is fed to an input of second transimpedance amplifier 135 of preamplifier circuit 150 for conversion of current (B) 515 to voltage (B) 525. Voltage elements (A+B) 520 and 525 and voltage signal (B) 525 are output from first and second amplifiers 130 and 135, respectively, and input to differential amplifier 140 of preamplifier circuit 150 for amplification of voltage signal (A) 520 and common mode rejection of voltage signal (B) 525. Voltage signal (A) 520 is output as differential digital signal (A) 530 for further signal processing.

Figure 10:
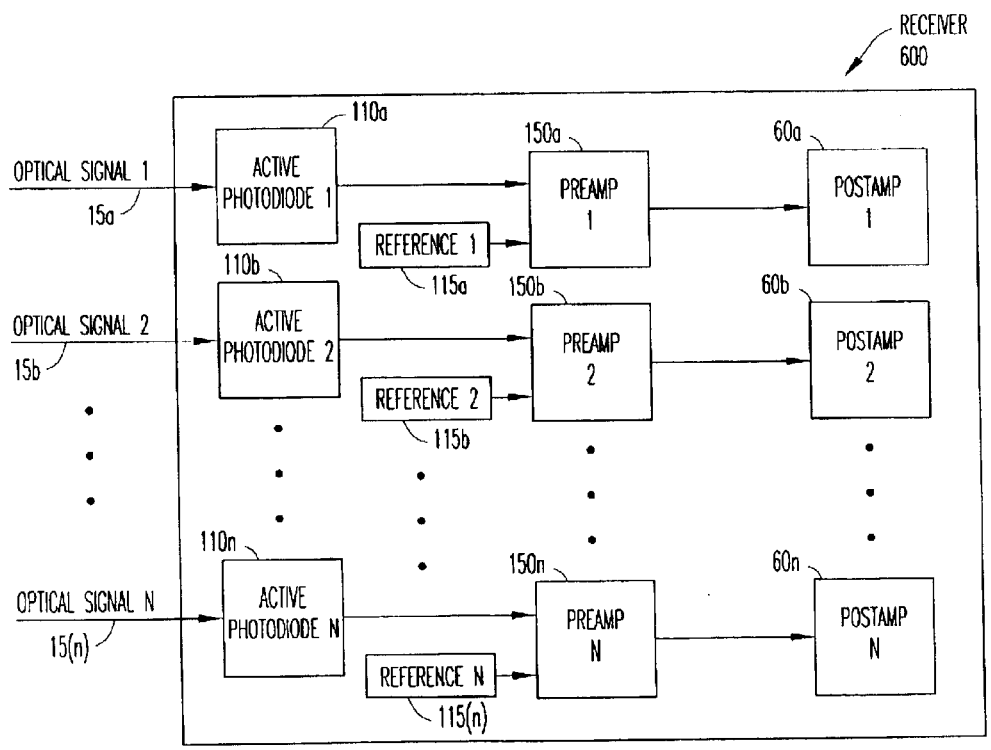
FIG. 10 is a block diagram of an exemplary optical receiver implementing the symmetrical photoamplifier circuit, in accordance with the invention.

The symmetrical photo-amplifier circuit can be used in a single channel device for conversion of a single optical signal to an appropriate voltage signal or in a multi-channel device for conversion of multiple optical signals to respective voltage signals. An example of a multi-channel device implementing the symmetrical photo-amplifier circuit is shown in FIG. 10. FIG. 10 illustrates optical receiver 600 that is capable of processing parallel optical data links, each carrying multiple channels (optical fibers). Each channel supplies a respective optical signal 15a, 15b, . . . , 15(n) to receiver 600 for conversion into an appropriate voltage for subsequent processing. For example, each link can include twelve channels, each transmitting light at a frequency in the gigabit/s range (e.g., 10 Gb/s), such that each link operates as a 120 Gb/s data transfer fiber optic device.

Optical signals 15a, 15b, . . . 15(n) from each channel are incident upon respective active photodiodes 110a, 110b, . . . , 110(n) for conversion into respective current signals. Each current signal is provided to respective preamplifier circuits 150a, 150b, . . . , 150(n) for conversion of the current signals into voltage signals and common mode rejection of noise signals using corresponding reference photodiodes 115a, 115b, . . . , 115(n) and symmetrical transimpedance amplifiers, as shown in FIG. 3. Voltage signals can be further processed by, for example, respective post amplifier circuits 60a, 60b, . . . 60(n).

As will be recognized by those skilled in the art, the innovative concepts described in the present application can be modified and varied over a wide range of applications. Accordingly, the scope of patented subject matter should not be limited to any of the specific exemplary teachings discussed, but is instead defined by the following claims.

We claim:

1. A photo-amplifier circuit, comprising:
a signal circuit coupled to receive an optical signal and a noise signal on a supply line to said signal circuit and produce an output signal from said optical signal and said noise signal, said signal circuit including first mechanical sources of inductance and parasitic capacitance; and
a reference circuit coupled to receive said noise signal and produce a reference signal from said noise signal, said reference circuit including second mechanical sources of inductance and parasitic capacitance, said first and second mechanical sources being matched to each other.

2. The photo-amplifier circuit of claim 1, further comprising:

a symmetrical amplifier circuit coupled to said signal circuit and said reference circuit to receive said output signal and said reference signal and output a differential signal, said symmetrical amplifier circuit being connected to common mode reject said noise signal from said differential signal.

3. The photo-amplifier circuit of claim 2, wherein said signal circuit comprises an active photodetector, and said reference circuit comprises a reference photodetector.

4. The photo-amplifier circuit of claim 3, wherein said first photodetector is a first photodiode and said second photodetector is a second photodiode, said first and second photodiodes being electrically similar.

5. The photo-amplifier circuit of claim 4, further comprising:

a substrate formed of semiconductor material, said first and second photodiodes being fabricated within said substrate.

6. The photo-amplifier circuit of claim 3, wherein said signal circuit comprises:

a first signal path coupled between said first photodetector and said symmetrical amplifier circuit for processing of said output signal, said first signal path including said first mechanical sources of inductance and parasitic capacitance.

7. The photo-amplifier circuit of claim 6, wherein said reference circuit comprises:

a second signal path coupled between said second photodetector and said symmetrical amplifier circuit for processing of said reference signal, said second signal path including said second mechanical sources of inductance and parasitic capacitance.

8. The photo-amplifier circuit of claim 7, wherein said first and second mechanical sources include bond wires between said photodetectors and said symmetrical amplifier circuit, the length of said bond wires in said first signal path being matched to the length of said bond wires in said second signal path.

9. The photo-amplifier circuit of claim 2, wherein said output signal is a first current and said reference signal is a second current, said symmetrical amplifier circuit comprises:

a first transimpedance amplifier connected to receive said first current and convert said first current to a first voltage and a second transimpedance amplifier connected to receive said second current and convert said second current said a second voltage.

10. The photo-amplifier circuit of claim 9, wherein said first voltage signal has a first voltage element representative of said optical signal and a second voltage element representative of said noise signal, said second voltage signal being substantially equivalent to said second voltage element, said symmetrical amplifier circuit further comprising:

a differential amplifier circuit connected to receive said first voltage signal and said second voltage signal, common mode reject said second voltage element and amplify said first voltage element.

11. The photo-amplifier circuit of claim 1, wherein said optical signal is in the gigabit/s range.

12. An optical receiver for receiving an optical signal and producing an electrical signal indicative of the intensity of said optical signal, comprising:

a first signal path connected to receive said optical signal and a noise signal and produce a first electrical signal from said optical signal and said noise signal, said first signal path including first mechanical sources of inductance and parasitic capacitance;

a second signal path connected to receive said noise signal and produce a second electrical signal from said noise signal, said second signal path including second mechanical sources of inductance and parasitic capacitance, said first and second mechanical sources being matched to each other, and a differential amplifier circuit coupled to receive said first electrical signal and said second electrical signal and output a third electrical signal, said differential amplifier circuit being connected to common mode reject said noise signal from said third electrical signal.

13. The optical receiver of claim 12, wherein said first signal path comprises:

an active photodetector connected to receive said optical signal and said noise signal and produce a first current from said optical signal and said noise signal; and a first transimpedance amplifier connected to receive said first current and convert said first current to said first electrical signal, said first electrical signal being a first voltage.

14. The optical receiver of claim 13, wherein said second signal path comprises:

a reference photodetector connected to receive said noise signal and produce a second current from said noise signal; and a second transimpedance amplifier connected to receive said second current and convert said second current to said second electrical signal, said second electrical signal being a second voltage.

15. The optical receiver of claim 14, wherein said first voltage signal has a first voltage element representative of said optical signal and a second voltage element representative of said noise signal, said second voltage signal being substantially equivalent to said second voltage element, said differential amplifier circuit being connected to common mode reject said second voltage element and amplify said first voltage element.

16. The optical receiver of claim 14, wherein said first photodetector is a first photodiode and said second photodetector is a second photodiode, said first and second photodiodes being electrically similar.

17. The optical receiver of claim 16, further comprising:

a substrate formed of semiconductor material, said first and second photodiodes being fabricated within said substrate.

18. The optical receiver of claim 12, wherein said optical signal is in the gigabit/s range.

19. A method for producing an electrical signal indicative of the intensity of an optical signal, comprising:

matching mechanical sources of inductance and parasitic capacitance along first and second signal paths;

receiving said optical signal and a noise signal, producing a first electrical signal on said first signal path from said optical signal and said noise signal, producing a second electrical signal on said second signal path from said noise signal, and providing said first electrical signal and said second electrical signal to a differential amplifier circuit for common mode rejection of said noise signal from said first electrical signal.

20. The method of claim 19, wherein said step of producing said first electrical signal further comprises the step of:

producing a first current from said optical signal and said noise signal; and converting said first current to a first voltage.

21. The method of claim 20, wherein said step of producing said second electrical signal further comprises.

producing a second current from said noise signal, and converting said second current to said second electrical signal, said second electrical signal being a second voltage.

22. The method of claim 21, wherein said step of receiving further comprises:

arranging an active photodiode to receive said optical signal and said noise signal; and arranging a reference photodiode to receive said noise signal, said first and second photodiodes being electrically similar.

23. The method of claim 19, wherein said optical signal is in the gigabit/s range.

* * * * *